US012604409B2

(12) United States Patent \
Kim et al.

(10) Patent No.: US 12,604,409 B2 \
(45) Date of Patent: Apr. 14, 2026

(54) PHOTONIC INTEGRATED CIRCUIT EMBEDDED SUBSTRATE AND PHOTONIC INTEGRATED CIRCUIT PACKAGE

(71) Applicant: SAMSUNG ELECTRO-MECHANICS CO., LTD., Suwon-si (KR)

(72) Inventors: Kwang Yun Kim, Suwon-si (KR); Kyung Sang Lim, Suwon-si (KR); Seung Eun Lee, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 371 days.

(21) Appl. No.: 18/108,846

(22) Filed: Feb. 13, 2023

(65) Prior Publication Data

US 2024/0032202 A1     Jan. 25, 2024

(30) Foreign Application Priority Data

Jul. 21, 2022     (KR) ........................ 10-2022-0090494

(51) Int. Cl.
H05K 1/18          (2026.01)
G02B 6/12          (2006.01)
(Continued)

(52) U.S. Cl.
CPC ......... *H05K 1/185* (2013.01); *G02B 6/12004* (2013.01); *H05K 1/0274* (2013.01);
(Continued)

(58) Field of Classification Search
CPC .. G02B 6/12004; H05K 1/185; H05K 1/0274; H05K 1/115; H05K 1/183;
(Continued)

(56) References Cited

U.S. PATENT DOCUMENTS

2006/0146681 A1* 7/2006 Shiba ................. G03G 15/5029
                                                 369/112.01
2006/0188207 A1   8/2006 Jung et al.
                        (Continued)

FOREIGN PATENT DOCUMENTS

CN          115685441 A  *  2/2023
KR   10-2006-0093219 A      8/2006
                  (Continued)

OTHER PUBLICATIONS

Office Action issued in corresponding Korean Patent Application No. 10-2022-0090494 dated Feb. 11, 2026, with English translation.

*Primary Examiner* — Jerry M Blevins
(74) *Attorney, Agent, or Firm* — MORGAN, LEWIS & BOCKIUS LLP

(57) ABSTRACT

A photonic integrated circuit embedded substrate may include: an embedded insulating layer on which a photonic integrated circuit is disposed, and at least one first insulating layer stacked on one surface of the embedded insulating layer. The at least one first insulating layer may have an optical path extending in a stacking direction of the at least one first insulating layer.

23 Claims, 8 Drawing Sheets

(51) Int. Cl.

| | |
|---|---|
| *H05K 1/02* | (2006.01) |
| *H05K 1/11* | (2006.01) |
| *H05K 1/183* | (2026.01) |
| *H05K 1/185* | (2026.01) |

(52) U.S. Cl.
CPC ............. *H05K 1/115* (2013.01); *H05K 1/183* (2013.01); *H05K 2201/096* (2013.01); *H05K 2201/09827* (2013.01); *H05K 2201/10121* (2013.01); *H05K 2201/10378* (2013.01)

(58) Field of Classification Search
CPC ... H05K 2201/096; H05K 2201/09827; H05K 2201/10121; H05K 2201/10378
USPC ........................................................ 385/14
See application file for complete search history.

(56) References Cited

U.S. PATENT DOCUMENTS

| | | | | |
|---|---|---|---|---|
| 2015/0219850 A1* | 8/2015 | Fish | ........................ | G02B 6/136 |
| | | | | 385/14 |
| 2016/0007460 A1* | 1/2016 | Shimizu | ................ | H05K 1/112 |
| | | | | 361/783 |
| 2017/0186739 A1 | 6/2017 | Budd et al. | | |
| 2020/0091124 A1* | 3/2020 | Liao | ..................... | G02B 6/4201 |
| 2021/0132309 A1 | 5/2021 | Zhang et al. | | |
| 2022/0304147 A1* | 9/2022 | Kim | ..................... | H05K 1/0296 |

FOREIGN PATENT DOCUMENTS

| | | |
|---|---|---|
| KR | 10-2013-0134062 A | 12/2013 |
| KR | 10-2021-0024840 A | 3/2021 |

\* cited by examiner 100a-1

100a-2

100a-3

100a-4

100a-5

100a-6

PHOTONIC INTEGRATED CIRCUIT EMBEDDED SUBSTRATE AND PHOTONIC INTEGRATED CIRCUIT PACKAGE

CROSS-REFERENCE TO RELATED APPLICATION(S)

This application claims benefit of priority to Korean Patent Application No. 10-2022-0090494 filed on Jul. 21, 2022 in the Korean Intellectual Property Office, the disclosure of which is incorporated herein by reference in its entirety.

TECHNICAL FIELD

The present disclosure relates to a photonic integrated circuit embedded substrate and a photonic integrated circuit package.

BACKGROUND

Increased communication data traffic is a trend that dramatically increases every year. Active technological development is being undertaken to support this breakthrough data in real time in a wireless network. For example, applications such as contentization of Internet of Thing (IoT)-based data, Augmented Reality (AR), Virtual Reality (VR), live VR/AR combined with SNS, autonomous driving, Sync View (real time transmission from a user's point of view using a miniature camera), and the like, require communications that support transmitting and receiving a large amount of data.

An increase in communication data traffic may require a wide bandwidth of a communication signal, and the wide bandwidth of a communication signal may be realized by increasing a speed (or frequency) of the communication signal, thereby requiring greater power or less energy loss.

Since an optical communication signal has a wide bandwidth and may be advantageous in reducing energy loss, it may efficiently handle an increase in communication data traffic, and can be generated from or converted into an electrical signal by a photonic integrated circuit.

SUMMARY

An aspect of the present disclosure is to provide a photonic integrated circuit embedded substrate and a photonic integrated circuit package.

According to an aspect of the present disclosure, a photonic integrated circuit embedded substrate may include: an embedded insulating layer on which a photonic integrated circuit is disposed; and at least one first insulating layer stacked on one surface of the embedded insulating layer. The at least one first insulating layer may have an optical path extending in a stacking direction of the at least one first insulating layer.

According to an aspect of the present disclosure, a photonic integrated circuit package may include: the photonic integrated circuit embedded substrate; and a base substrate disposed on one surface of the photonic integrated circuit embedded substrate and having a structure in which at least one base insulating layer and at least one base conductive layer are alternately stacked. The base substrate may have an extended optical path overlapping the optical path in the stacking direction.

According to an aspect of the present disclosure, a substrate may include: a photonic integrated circuit disposed in the substrate and spaced apart from an upper surface and a lower surface of the substrate which oppose each other in a thickness direction of the substrate; a first opening, as an optical path, extending from the lower surface of the substrate to expose a portion of the photonic integrated circuit; an electrical path extending from the upper surface of the substrate to connect to the photonic integrated circuit, and overlapping the photonic integrated circuit in the thickness direction; and a first cover insulating layer, as a lowermost insulating layer of the substrate, having a plurality of second openings to respectively expose first pads of one of wiring layers of the substrate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1A:
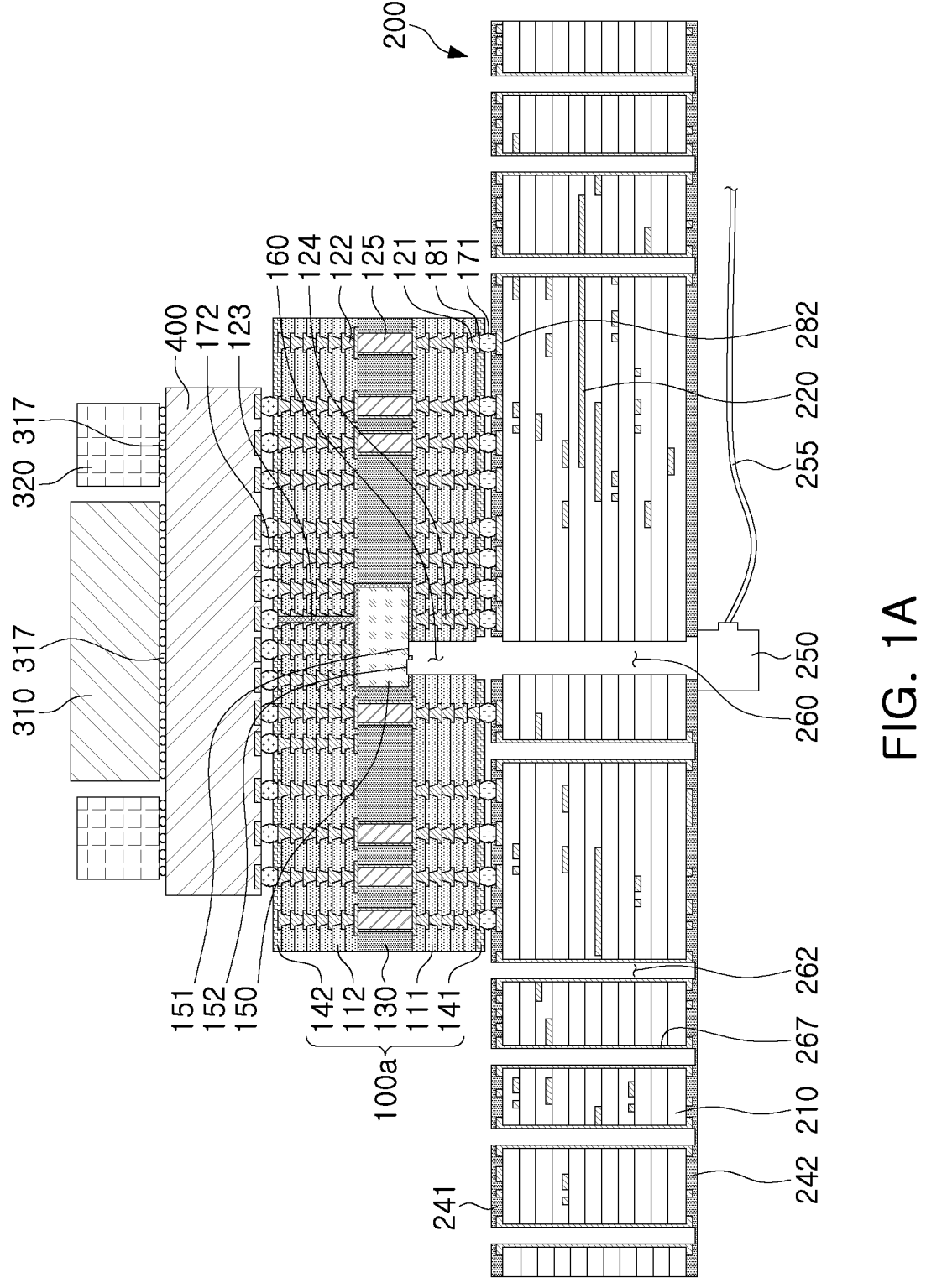
FIG. 1A is a side view illustrating a photonic integrated circuit embedded substrate and a photonic integrated circuit package according to an embodiment of the present disclosure.

Hereinafter, exemplary embodiments of the present disclosure will be described in detail with reference to the accompanying drawings. Further, these embodiments are provided so that this disclosure will be thorough and complete, and will fully convey the scope of the disclosure to those skilled in the art. It should be understood that the various embodiments of the present disclosure are different, but need not be mutually exclusive. For example, certain features, structures, and characteristics described herein may be implemented in other exemplary embodiments without departing from the spirit and the scope of the present disclosure in connection with an exemplary embodiment. In addition, it is also to be understood that the position or disposition of individual components within each disclosed exemplary embodiment may be varied without departing from the spirit and the scope of the present disclosure. Therefore, the following detailed description is not to be taken in a limited meaning, and the scope of the present disclosure is to be limited only by the appended claims, along with the full scope of equivalents to which the claims are entitled, if properly explained. In the drawings, like reference numerals refer to the same or similar functions throughout the several aspects.

Hereinafter, exemplary embodiments of the present disclosure will be described in detail with reference to the accompanying drawings so that those skilled in the art may easily carry out the present disclosure.

Figure 1B:
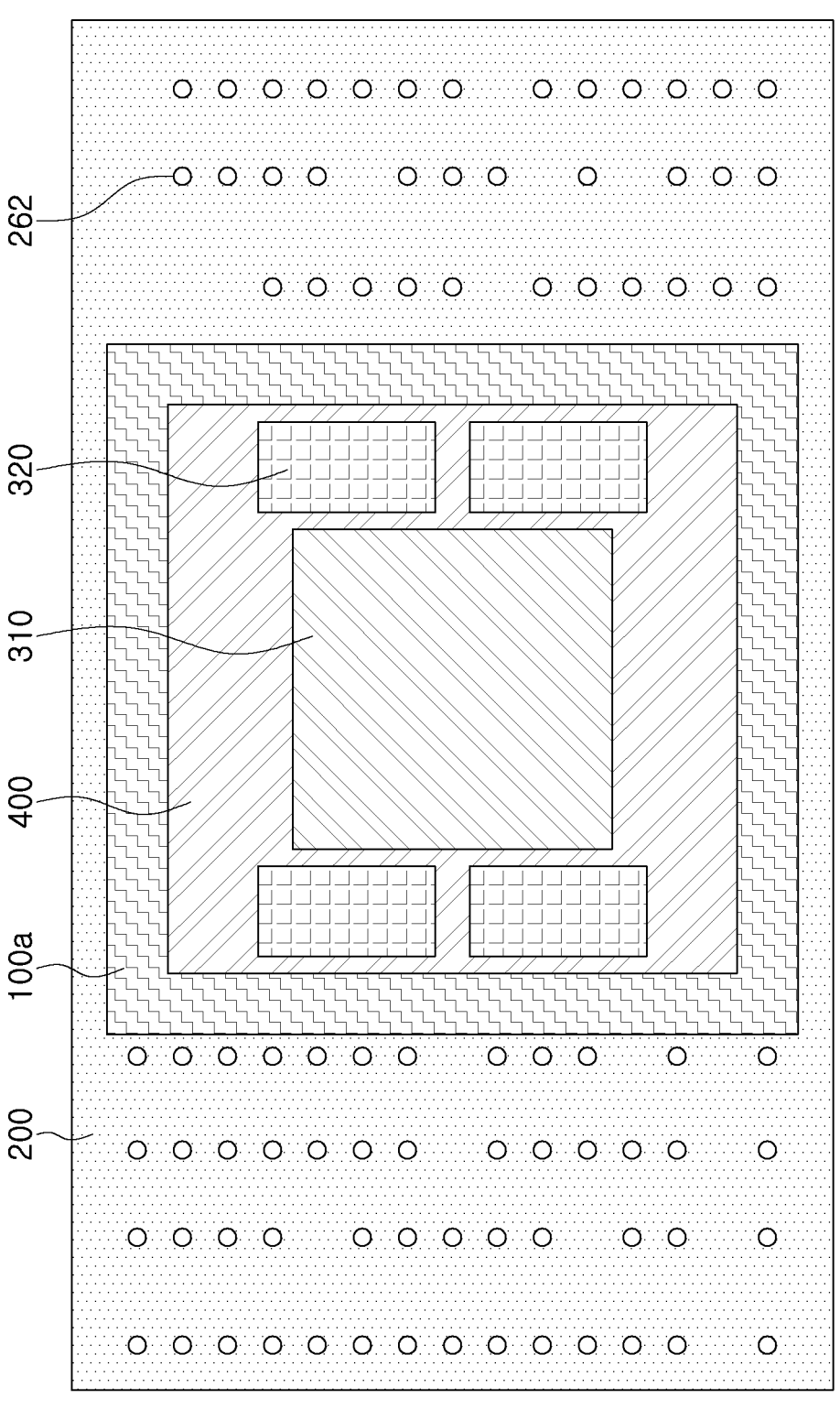
FIG. 1B is a plan view illustrating a photonic integrated circuit embedded substrate and a photonic integrated circuit package according to an embodiment of the present disclosure.

Referring to FIGS. 1A and 1B, a photonic integrated circuit package according to an embodiment of the present disclosure may include a photonic integrated circuit embedded substrate 100a, and the photonic integrated circuit embedded substrate 100a may include at least one first insulating layer 111 and an embedded insulating layer 130, and provide a structure in which a photonic integrated circuit 150 is embedded.

The photonic integrated circuit 150 may perform conversion processing between an optical communication signal and an electrical signal. For example, the photonic integrated circuit 150 may include a light emitting unit 151 for outputting an optical communication signal based on an input electrical signal to an optical path 160, and a light receiving unit 152 for receiving an optical communication signal through the optical path 160 and converting the same into the electrical signal. For example, the light emitting unit 151 and the light receiving unit 152 may include a light emitting diode and a light receiving diode, respectively, and may be disposed on one surface (e.g., a lower surface) of the photonic integrated circuit 150.

For example, the photonic integrated circuit 150 may include a fine interconnection through which the electrical signal passes, and the fine interconnection may be a portion of a circuit. Depending on the design, the photonic integrated circuit 150 may further include a circuit that is connected to the fine interconnection and performs at least one of amplification, frequency conversion, frequency filtering, and phase control on the electrical signal, but an embodiment thereof is not limited thereto. Depending on the design, at least a portion of the circuit may be disposed on a semiconductor chip 310 instead of the photonic integrated circuit 150.

The embedded insulating layer 130 may have a cavity in which a photonic integrated circuit 150 is disposed. The embedded insulating layer 130 may surround the photonic integrated circuit 150. For example, the embedded insulating layer 130 may be a core of a printed circuit board, and the cavity may be a through-cavity, but an embodiment thereof is not limited thereto. For example, the embedded insulating layer 131 of FIG. 3C may not be the core, and a thickness of the embedded insulating layer 131 of FIG. 3C may be thinner than that of the embedded insulating layer 130 of FIG. 1A.

The at least one first insulating layer 111 may be stacked on one surface (e.g., a lower surface) of the embedded insulating layer 130, and may have an optical path 160 extending in a stacking direction (e.g., a vertical direction) of the at least one first insulating layer 111.

One surface (e.g., a lower surface) of the at least one first insulating layer 111 may provide a structure, advantageous for being disposed on the one surface (e.g., the lower surface) of the optical connector 250 or the base substrate 200 on which the optical connector 250 is disposed.

Accordingly, since the optical path 160 may not require a horizontal path between the photonic integrated circuit 150 and the optical connector 250, the optical path 160 may provide a structure, advantageous for reducing a length of an overall path of a signal, input/output to and from the photonic integrated circuit 150 (an electrical signal and an optical communication signal), reduce energy loss in the path, and the photonic integrated circuit embedded substrate 100a and the photonic integrated circuit package according to an embodiment of the present disclosure may have a more miniaturized structure overall.

For example, since the optical path 160 may overlap the photonic integrated circuit 150 in a stacking direction (e.g., a vertical direction), the optical path 160 may have a structure having no horizontal path between the photonic integrated circuit 150 and the optical connector 250, but an embodiment thereof is not limited thereto.

FIG. 1A discloses a structure in which the number of layers of at least one first insulating layer 111 is five, but the number of layers of at least one first insulating layer 111 may be freely changed depending on the design. According to the number of layers of the at least one first insulating layer 111, a length of the optical path 160 may also be changed.

Not only the length of the optical path 160 but also a width of the optical path 160 may be freely changed depending on the design, such as a method of forming a conductive via in a printed circuit board. The width of the optical path 160 may be determined according to the characteristics of the light emitting unit 151 and the light receiving unit 152 of the photonic integrated circuit 150, the length of the optical path 160, or the structure of the base substrate 200, but an embodiment thereof is not limited thereto.

Accordingly, in the photonic integrated circuit board 100a and the photonic integrated circuit package according to an embodiment of the present disclosure, since a structure, advantageous for increasing a degree of design freedom of the optical path 160 (e.g., length, width, symmetry, robustness of process dispersion, ease of adding noise blocking structures, and the like) may be provided, energy loss in the optical path 160 can be reduced.

For example, the at least one first insulating layer 111 may contain a photosensitive insulating material. Accordingly, the optical path 160 may be formed by exposing and developing a portion of the at least one first insulating layer 111 by a photolithography method, and the width of the optical path 160 may be designed more freely and further can be accurately implemented.

Referring to FIG. 1A, the photonic integrated circuit embedded substrate 100a may further include a cover insulating layer 141 stacked on one surface (e.g., a lower surface) of at least one first insulating layer 111 and having a plurality of openings. One portion of the plurality of openings may overlap the optical path 160 in a stacking direction (e.g., a vertical direction), and the other portion. of the plurality of openings may provide a space in which the solder 171 is disposed.

For example, since the cover insulating layer 141 may provide one surface (e.g., a lower surface) of the photonic integrated circuit embedded substrate 100a, and may be implemented as a solder resist of a printed circuit board, the cover insulating layer 141 may contain a photosensitive insulating material. Accordingly, the plurality of openings of the cover insulating layer 141 may be formed in a manner similar to that of the optical path 160, but an embodiment thereof is not limited thereto For example, the cover insulating layer 141 and the at least one first insulating layer 111 may be a copper clad laminate (CCL), ABF, prepreg, FR-4, Bismaleimide Triazine (BT), and Photo Imagable Dielectric: PID) resin, and may be a thermosetting resin such as an epoxy resin, a thermoplastic resin such as polyimide, polytetrafluoroethylene (PTFE) , and at least one selected from a group of resins of a glass-based, and a ceramic-based (for example, Low Temperature Co-fired Ceramic (LTCC).

Referring to FIG. 1A, the photonic integrated circuit embedded substrate 100a may include at least one of first conductive via 121 and 124 penetrating through the at least one first insulating layer 111 in a stacking direction (e.g., a vertical direction). For example, at least one of the first conductive vias 121 and 124 may have a structure in which at least one through-hole formed in the at least one first insulating layer 111 is plated or a metal material is filled, and may be formed by a method similar to a method of forming a structure vertically connecting different conductive layers in a printed circuit board.

The at least one of first conductive via 121 and 124 may be used as an electrical path through which an electrical signal input/output to and from the photonic integrated circuit 150 or a signal corresponding to the electrical signal passes. One portion 121 of the first conductive via may electrically connect between the base substrate 200 and the semiconductor chip 310, and the other portion 124 of the first conductive via may electrically connect between the semiconductor chip 310 and the photonic integrated circuit 150. When the base substrate 200 or the semiconductor chip 310 is not embedded in the photonic integrated circuit embedded substrate 100a, at least one of the first conductive vias 121 and 124 may be connected to solder 171, and the solder 171 may be disposed to overlap in a vertical direction.

Referring to FIG. 1A, the photonic integrated circuit embedded substrate 100a may further include an embedded conductive via 125 penetrating through the embedded insulating layer 130 in a stacking direction (e.g., a vertical direction) and connected to at least one first conductive via 121. For example, when the built-in insulating layer 130 is a core of a printed circuit board, the embedded conductive via 125 may be formed in a manner similar to the method of forming a through-via of the printed circuit board.

Referring to FIG. 1A, the photonic integrated circuit embedded substrate 100a may further include at least one second insulating layer 112 stacked on the other surface (e.g., an upper surface) of the embedded insulating layer 130. For example, the at least one second insulating layer 112 may be formed in a similar manner as the at least one first insulating layer 111, and contain the same insulating material as the at least one first insulating layer 111. Accordingly, the number of layers of the at least one second insulating layer 112 may be freely changed depending on the design.

For example, the at least one second insulating layer 112 may not have an additional optical path (not including a path of an electrical signal corresponding to an optical communication signal) such as the optical path 160. Accordingly, the at least one second insulating layer 112 may have a more physically stable structure, and may further improve physical stability of the photonic integrated circuit embedded substrate 100a.

Referring to FIG. 1A, the photonic integrated circuit embedded substrate 100a may include at least one of second and third conductive vias 122 and 123 penetrating through the at least one second insulating layer 112 in a stacking direction (e.g., a vertical direction). The second and third conductive vias 122 and 123 may be formed in a similar manner to the at least one of first conductive via 121 and 124, and may contain the same conductive material as the at least one first conductive via 121 and 124 (e.g., at least one of copper (Cu), silver (Ag), palladium (Pd), aluminum (Al), nickel (Ni), titanium (Ti), gold (Au), and platinum (Pt)).

The at least one second conductive via 122 may be connected to an embedded conductive via 125, and the at least one third conductive via 123 may be disposed to overlap the photonic integrated circuit 150 in a stacking direction (e.g., a vertical direction). Depending on the design, the photonic integrated circuit 150 may be electrically connected to the at least one third conductive via 123 to have a short electrical path to the semiconductor chip 310, or may be used as a heat dissipation path of the at least one third conductive via 123.

Referring to FIGS. 1A and 1B, a photonic integrated circuit package according to an embodiment of the present disclosure may include a base substrate 200 disposed on one surface (e.g., a lower surface) of a photonic integrated circuit embedded substrate 100a and having a structure in which at least one base insulating layer 210 and at least one base conductive layer 220 are alternately stacked. When at least one first insulating layer 111 of the photonic integrated circuit board 100a contains a photosensitive insulating material, an insulating material of the at least one base insulating layer 210 (for example, an insulating material having lower photosensitivity than the photosensitive insulating material) may be different from that of the at least one first insulating layer 111.

For example, the base substrate 200 may be a printed circuit board manufactured separately from the photonic integrated circuit embedded substrate 100a, and may be electrically connected to the photonic integrated circuit embedded substrate 100a through solder 171. Since the solder 171 may have a melting point, lower than a melting point of the base conductive layer 220, the solder 171 may be fixed in a state of being disposed in a plurality of openings of a cover insulating layer 141 and a base cover insulating layer 241 in a fluid state by a reflow method.

The base cover insulating layer 241 and an additional base cover insulating layer 242 may provide one surface (e.g., an upper surface) and the other surface (e.g., a lower surface) of the base substrate 200 with the base insulating layer 210 interposed therebetween, respectively, and may be formed in a manner, similar to that of the cover insulating layer 141.

For example, the base substrate 200 may be at least a portion of a main board of an electronic device providing optical communication, and may include a through hole 262 or a through via 267.

For example, the other surface (e.g., a lower surface) of the base substrate 200 may provide a dispositional area for an optical connector 250. For example, the optical connector 250 may be assembled into an additional structure for attaching and detaching to the additional base cover insulating layer 242 or may be adhered to the additional base cover insulating layer 242. The optical connector 250 may be coupled to an optical fiber 255.

The base substrate 200 may have an extended optical path 260 overlapping the optical path 160 of the photonic integrated circuit embedded substrate 100a in a stacking direction (e.g., in a vertical direction). The optical path 160 and the extended optical path 260 may be connected in series between the photonic integrated circuit 150 and the optical connector 250. Accordingly, since the base substrate 200 can reduce an area of an upper surface and a lower surface thereof by as much as the size of the extended optical path 260, and an overall size of the photonic integrated circuit package according to an embodiment of the present disclosure can be effectively reduced.

Referring to FIGS. 1A and 1B, the photonic integrated circuit package according to an embodiment of the present disclosure may further include a semiconductor chip 310 disposed on the other surface (e.g., an upper surface) of the photonic integrated circuit embedded substrate 100*a*. For example, the semiconductor chip 310 may include a semiconductor switch that selectively switches whether or not a plurality of electrical connections are made between the photonic integrated circuit 150 and the base substrate 200. The semiconductor switch may be implemented as a transistor.

Depending on the design, the semiconductor chip 310 may include not only an analog processing circuit such as a switch, but also a digital circuit such as a processor, and a power management circuit for effectively providing power to the semiconductor chip 310 and/or the photonic integrated circuit 150.

The passive component 320 may be electrically connected to the semiconductor chip 310 and/or the photonic integrated circuit 150 to provide impedance.

Referring to FIGS. 1A and 1B, the photonic integrated circuit package according to an embodiment of the present disclosure may further include: an interposer substrate 400 disposed between a photonic integrated circuit embedded substrate 100*a* and a semiconductor chip 310 to electrically connect between the photonic integrated circuit embedded substrate 100*a* and the semiconductor chip 310.

For example, the interposer substrate 400 may have a structure similar to that of a printed circuit board, or may be formed of a silicon semiconductor package. The interposer substrate 400 may have a first electrical path electrically connected to the photonic integrated circuit 150 and a second electrical path electrically connected to the base substrate 200 by bypassing the photonic integrated circuit 150. Each of the first and second electrical paths may include conductive vias and/or interconnections.

One surface (e.g., a lower surface) of the interposer substrate 400 may face an additional cover insulating layer 142 of a photonic integrated circuit integrated circuit embedded substrate 100*a*, and an additional solder 172 may electrically connect between and fix the interposer substrate 400 and the photonic integrated circuit embedded substrate 100*a* in a state in which the interposer substrate 400 and the integrated circuit embedded substrate 100*a* are manufactured separately from each other. The semiconductor chip 310 and the passive component 320 may be mounted on the other surface (e.g., an upper surface) of the interposer substrate 400 through an additional solder 317.

Figure 2A:
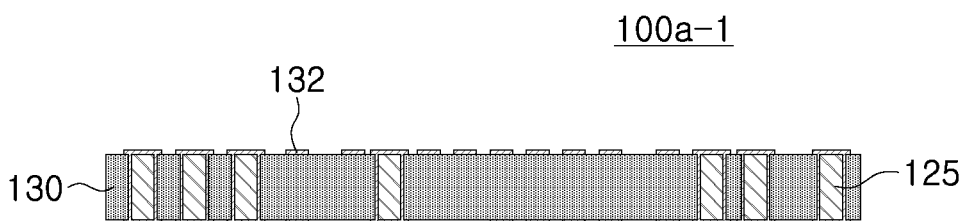
FIGS. 2A and 2B are side views illustrating a method of manufacturing a photonic integrated circuit embedded substrate according to an embodiment of the present disclosure.
Figure 2A:
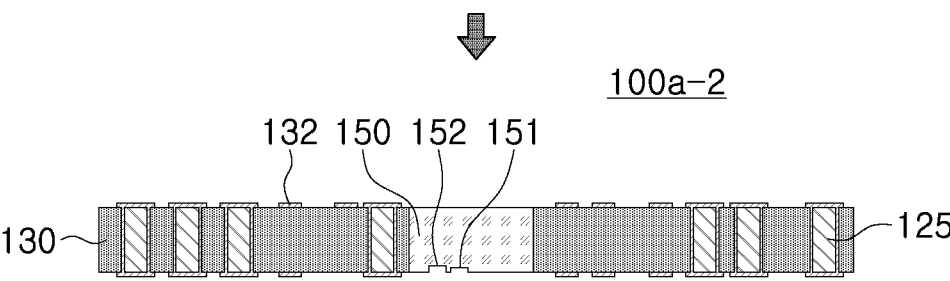
Figure 2A:
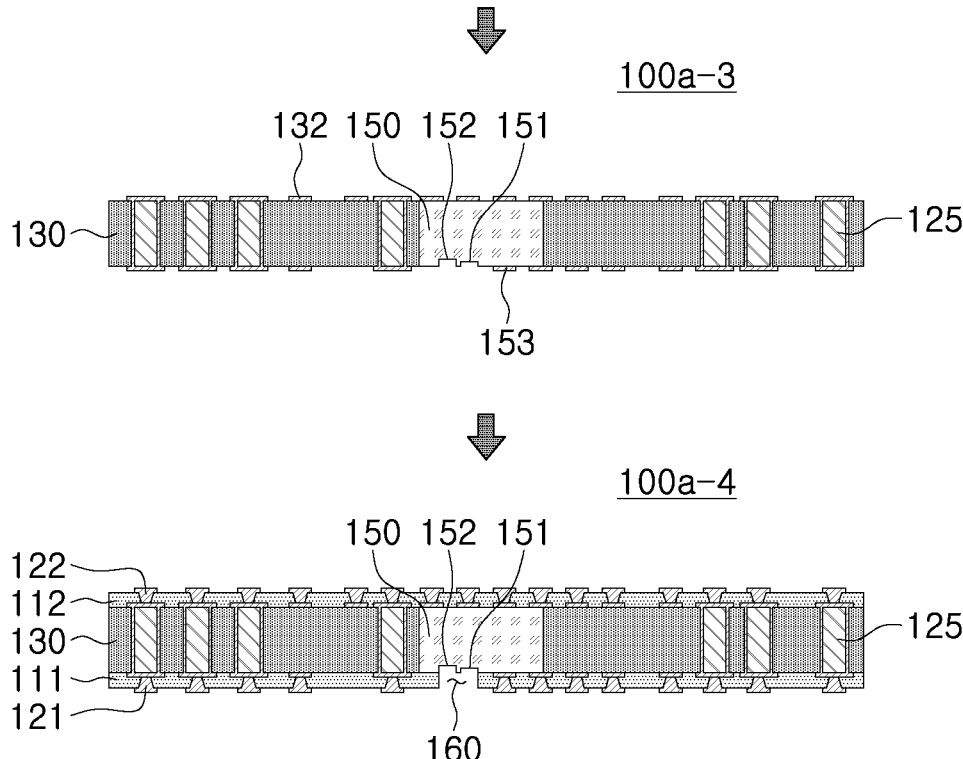

Referring to FIG. 2A, a photonic integrated circuit embedded substrate 100*a*-1 in a first step may include a conductive layer 132 disposed on an upper and a lower surface of an embedded insulating layer 130 and an embedded conductive via 125 penetrating through the embedded insulating layer 130. For example, the conductive layer 132 may include an interconnection and a conductive plate surrounding the interconnection. For example, the interconnection and the conductive plate may be formed by a photolithography method in a state in which a protective pattern is formed on the conductive layer 132, and the protective pattern may be removed.

Referring to FIG. 2A, a photonic integrated circuit embedded substrate 100*a*-2 in a second step may include a structure in which a photonic integrated circuit 150 is disposed in a cavity formed in an embedded insulating layer 130. For example, the cavity may be formed by colliding a large number of fine particles on a portion of the embedded insulating layer 130 or drilling through a hole, or irradiating a laser on an edge of the portion.

Referring to FIG. 2A, a photonic integrated circuit embedded substrate 100*a*-3 in a third step may include a semiconductor chip pad 153 formed on at least one of one surface and the other surface of the photonic integrated circuit 150.

Referring to FIG. 2A, a photonic integrated circuit embedded substrate 100*a*-4 in a fourth step may include first and second insulating layers 111 and 112 respectively formed on upper and lower surfaces of an embedded insulating layer 130. Depending on the design, an optical path 160 may be formed before or after the first insulating layer 111 is disposed on the embedded insulating layer 130. For example, when the first insulating layer 111 contains a photosensitive insulating material, the optical path 160 may be formed by a photolithography method in a state in which a protective pattern is formed on one surface (e.g., a lower surface) of the first insulating layer 111, and the protective pattern may be removed. Accordingly, the optical path 160 may penetrate through the first insulating layer 111 and may comprise air or a vacuum.

Figure 2B:
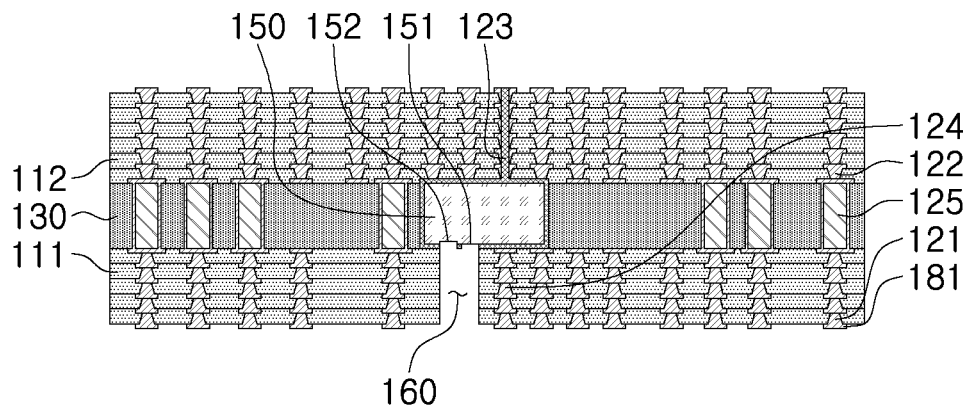
Figure 2B:
Figure 2B:
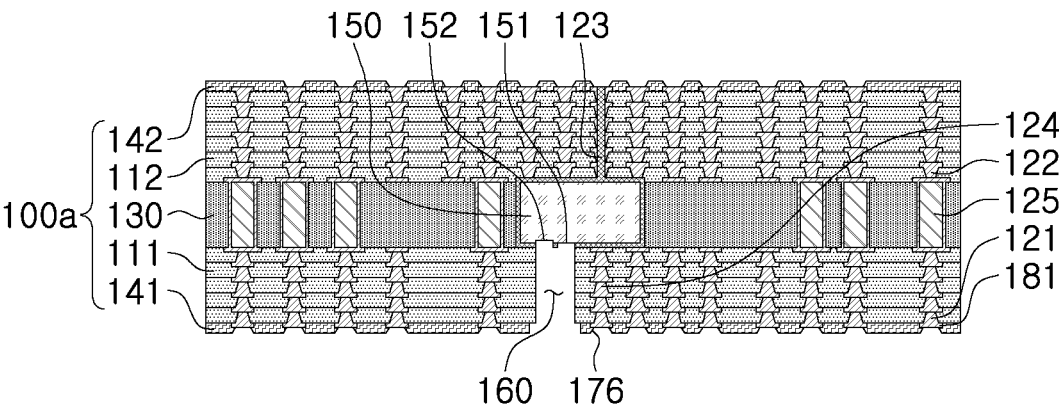

Referring to FIG. 2B, a photonic integrated circuit embedded substrate 100*a*-5 in a fifth step may include a plurality of first and second insulating layers 111 and 112 respectively built-up on upper and lower surfaces of an embedded insulating layer 130 by repeating the fourth step, respectively. The conductive layer may be disposed between each the plurality of first and second insulating layers 111 and 112, and a first pad 181 may be disposed on one surface (e.g., a lower surface) of the plurality of first insulating layers 111.

Referring to FIG. 2B, a photonic integrated circuit embedded substrate 100*a*-6 in a sixth step may have a structure in which a cover insulating layer 141 and an additional cover insulating layer 142 are formed on a plurality of first and second insulating layers 111 and 112. The cover insulating layer 141 may have an opening formed to expose the first pad 181 externally.

Figure 2C:
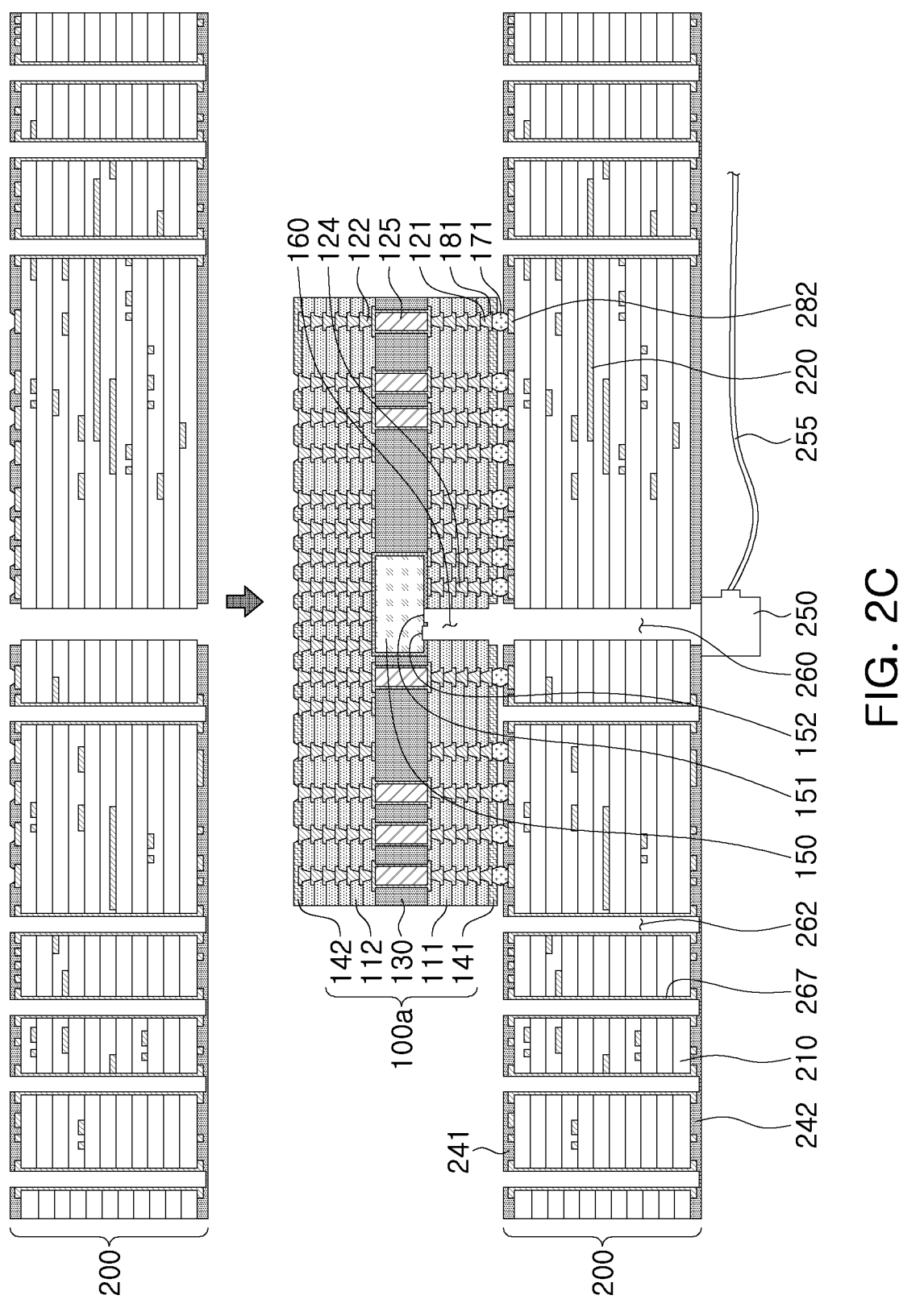
FIG. 2C is a side view illustrating a method of manufacturing a photonic integrated circuit package according to an embodiment of the present disclosure.

Referring to FIG. 2C, the photonic integrated circuit embedded substrate 100*a* may be mounted on one surface (e.g., an upper surface) of a base substrate 200 in a state in which the base substrate 200 and the photonic integrated circuit embedded substrate 100*a* are separately manufactured from each other. For example, an extended optical path 260 of the base substrate 200 may be formed by drilling before the photonic integrated circuit embedded substrate 100*a* is mounted.

Figure 3A:
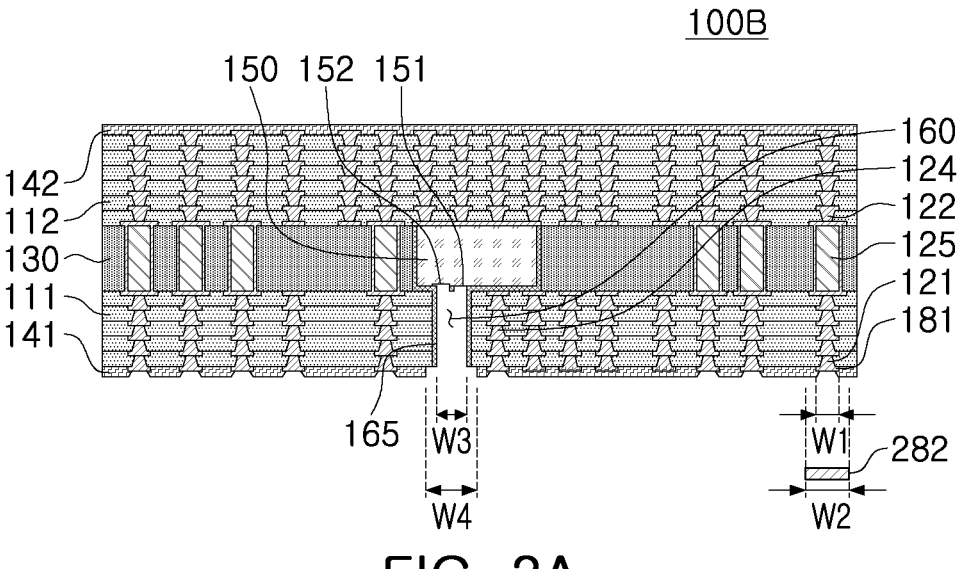
FIG. 3A is a side view illustrating a photonic integrated circuit embedded substrate and a conductive tube according to an embodiment of the present disclosure.

Referring to FIG. 3A, a photonic integrated circuit embedded substrate 100B according to an embodiment of the present disclosure may further include a conductive tube 165 surrounding the optical path 160. For example, the conductive tube 165 may be formed by plating.

Referring to FIG. 3A, a width W4 of an opening overlapping the optical path 160 in a vertical direction among a plurality of openings of a cover insulating layer 141 may be wider than a width W3 of the optical path 160. Accordingly, position matching accuracy between the optical path 160 and the extended optical path may be more stably matched.

Referring to FIG. 3A, a width W1 of a first pad 181 exposed by the other portion of the plurality of openings of the cover insulating layer 141 may be narrower than a width W2 of a second pad 282 of the base substrate. Accordingly, a degree of integration of an electrical path of a photonic integrated circuit embedded substrate 100B may be higher than that of the base substrate.

Figure 3B:
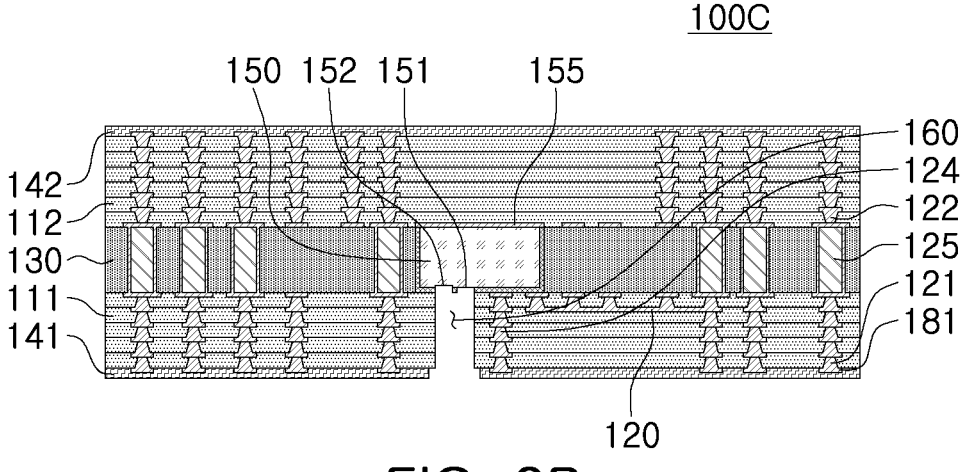
FIG. 3B is a side view illustrating a unidirectional input/output structure of a photonic integrated circuit of a photonic integrated circuit embedded substrate according to an embodiment of the present disclosure.

Referring to FIG. 3B, a photonic integrated circuit embedded substrate 100C according to an embodiment of the present disclosure may include a cavity support portion 155 disposed on the other surface (e.g., an upper surface) of the photonic integrated circuit 150. For example, the cavity support portion 155 may have a plate shape corresponding to a horizontal area of the photonic integrated circuit 150. In the photonic integrated circuit 150, not only an optical communication signal but also an electrical signal may be transmitted/received to and from the semiconductor chip through a pad and an interconnection 120 on one surface (e.g., a lower surface) of the photonic integrated circuit 150. For example, the interconnection 120 may be implemented using a semi-additive process (SAP), a modified semi-additive process (MSAP), or a subtractive method.

Figure 3C:
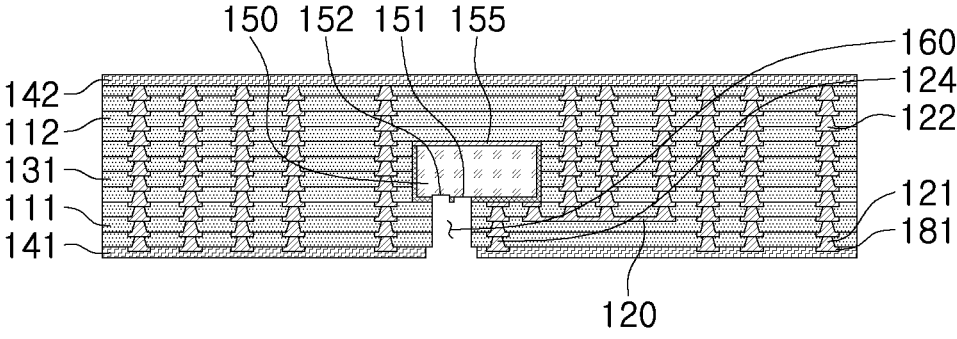
FIG. 3C is a side view illustrating a structure in which a photonic integrated circuit embedded in a photonic integrated circuit embedded substrate is embedded in a blind cavity according to an embodiment of the present disclosure.

Referring to FIG. 3C, a photonic integrated circuit embedded substrate 100D according to an embodiment of the present disclosure may have a structure in which an embedded insulating layer 131 and first and second insulating layers 111 and 112 are formed in substantially the same manner. For example, the embedded insulating layer 131 may be stacked on a lower surface of the second insulating layer 112, and a portion of the embedded insulating layer 131 (a portion in which a photonic integrated circuit 150 is disposed) may be etched. In this case, the cavity support portion 155 may act as a stopper to prevent the second insulating layer 112 from being etched. Accordingly, the photonic integrated circuit 150 may be disposed in a blind cavity. Thereafter, the first insulating layer 111 may be stacked on a lower surface of the embedded insulating layer 131.

Figure 4A:
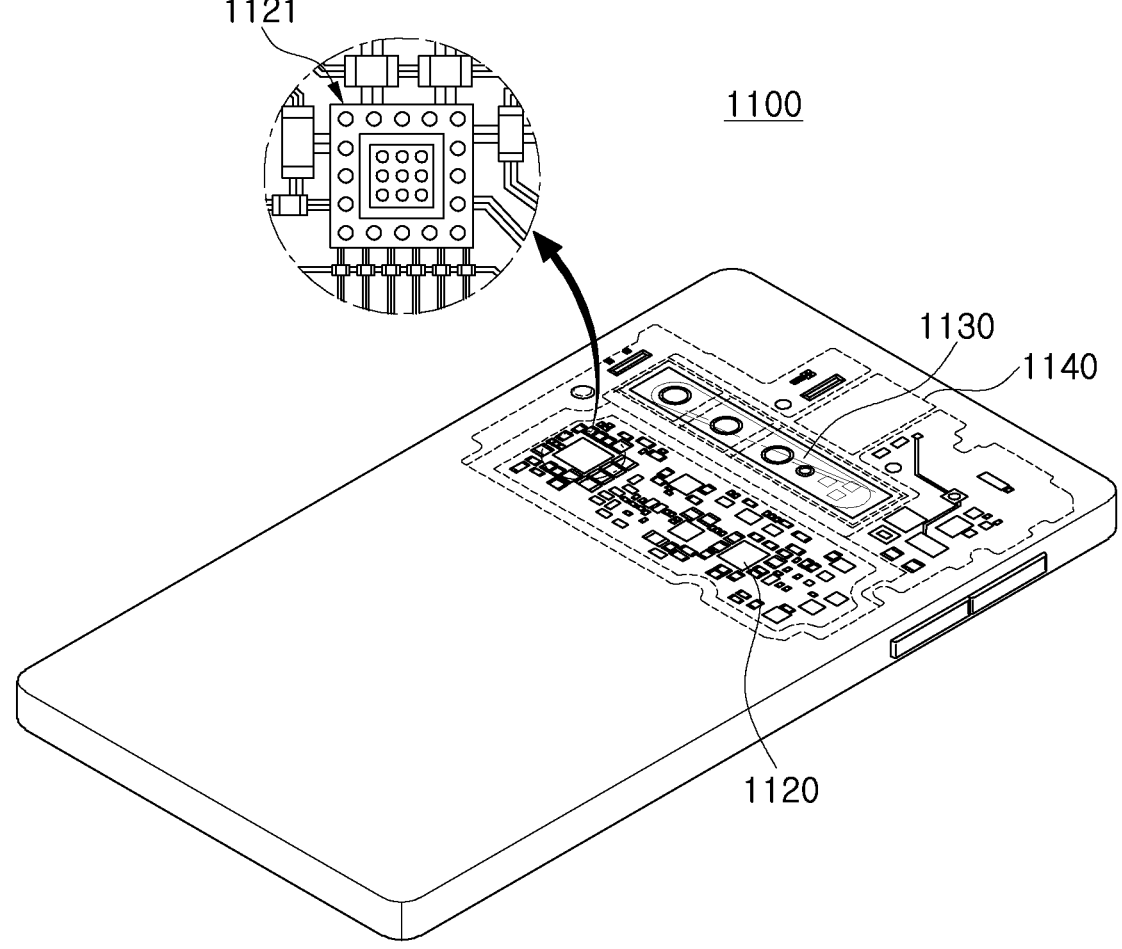
FIG. 4A is a diagram illustrating a structure of an electronic device in which a photonic integrated circuit embedded substrate and a photonic integrated circuit package may be disposed according to an embodiment of the present disclosure.
Figure 4B:
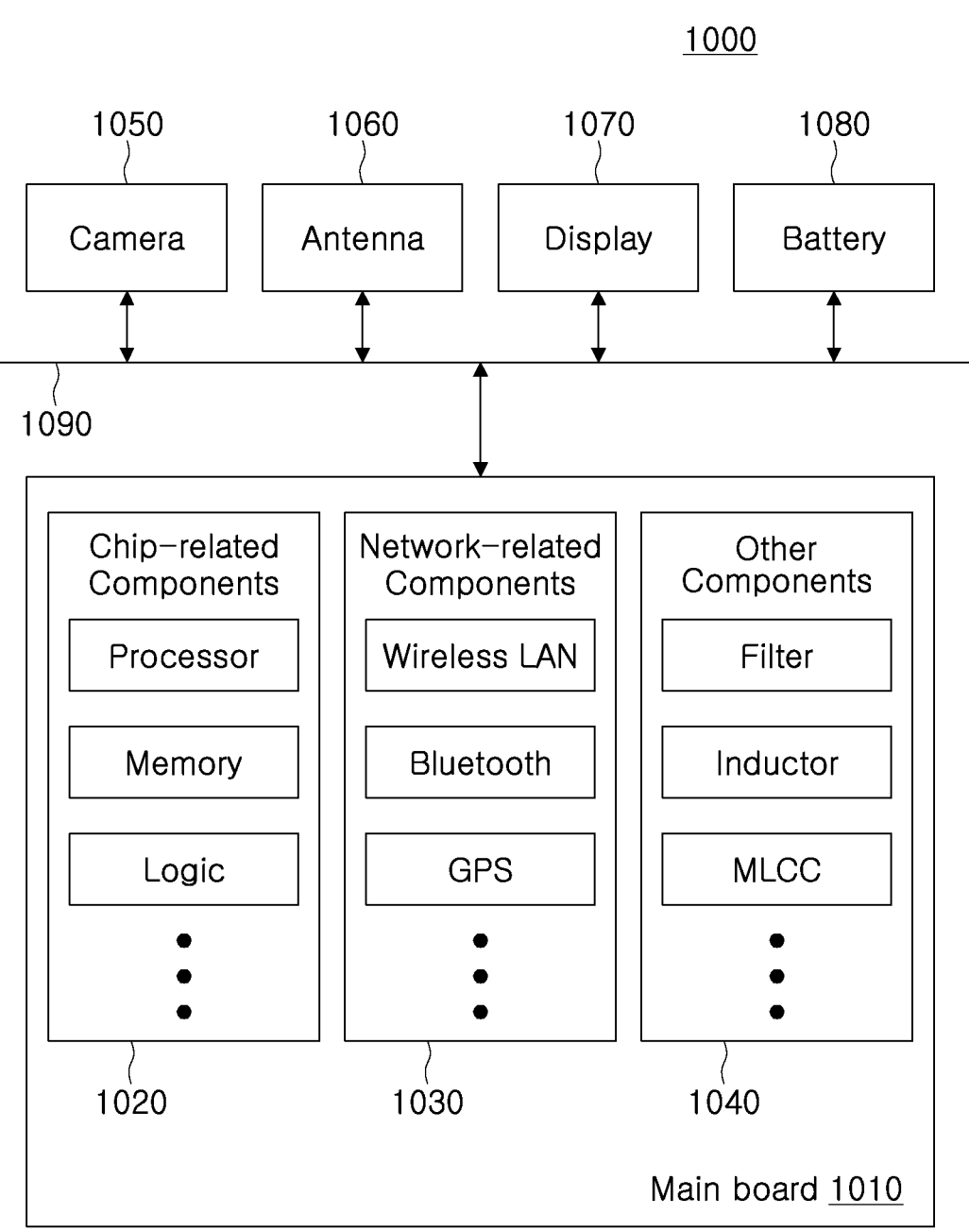
FIG. 4B is a diagram illustrating a system of an electronic device in which a photonic integrated circuit embedded substrate and a photonic integrated circuit package may be disposed according to an embodiment of the present disclosure.

Referring to FIGS. 4A and 4B, an electronic device 1000 may accommodate a mainboard 1010. The mainboard 1010 may include chip-related components 1020, network-related components 1030, other components 1040, or the like, physically or electrically connected thereto. These components may be connected to others to be described below to form various signal lines 1090.

The chip-related components 1020 may include: a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, but the chip-related components 1020 are not limited thereto, and may include other types of chip-related components. In addition, the chip-related components 1020 may be combined with each other. The chip-related component 1020 may be in a form of a package including the above-described chip or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the mainboard 1010. These other components may include, for example, a camera module 1050, an antenna module 1060, a display 1070, a battery 1080, or the like. However, an embodiment thereof is not limited thereto, and may include, an audio codec, a video codec, a power amplifier, a compass, an accelerometer, a gyroscope, a speaker, a mass storage unit (for example, a hard disk drive), a compact disk (CD), a digital versatile disk (DVD), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

The electronic device may be, for example, a smartphone 1100. A motherboard 1110 is accommodated inside the smartphone 1100, and various components 1120 are physically and/or electrically connected to the motherboard 1110. In addition, other components that may or may not be physically and/or electrically connected to the motherboard 1110 are accommodated therein, such as the camera module 1130 and/or the speaker 1140. A portion of the component 1120 may be the aforementioned chip-related component, for example, a component package 1121, but an embodiment thereof is not limited thereto. The component package 1121 may be in a form of a photonic integrated circuit embedded substrate on which an electronic component including an active component and/or a passive component are surface-mounted. Alternatively, the component package 1121 may be in a form of a photonic integrated circuit embedded substrate in which an active component and/or a passive component are embedded. Meanwhile, the electronic device is not necessarily limited to the smart phone 1100, and may be any other electronic device as described above. The motherboard 1110 may be a photonic integrated circuit embedded substrate according to an embodiment of the present disclosure, but the photonic integrated circuit embedded substrate is not limited to the motherboard 1110.

As set forth above, according to an embodiment of the present disclosure, a photonic integrated circuit embedded substrate and a photonic integrated circuit package according to an embodiment of the present disclosure may provide a structure, advantageous for reducing an overall path length of a signal, input and output to and from the photonic integrated circuit, thereby reducing energy loss in the path.

Alternatively, in the photonic integrated circuit embedded substrate and the photonic integrated circuit package according to an embodiment of the present disclosure, since a structure, advantageous for increasing a degree of design freedom in an optical path through which light input and output to and from the photonic integrated circuit can pass (e.g., length, width, symmetry, robustness of process dispersion, ease of adding a noise blocking structure, and the like), may be provided, energy loss in the optical path may be reduced.

Alternatively, in the photonic integrated circuit embedded substrate and the photonic integrated circuit package according to an embodiment of the present disclosure, since a structure advantageous for reducing a path in a horizontal direction in the overall path of signals and light input and output to and from to the photonic integrated circuit, may be provided, it is possible to have a more compact structure overall.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

While exemplary embodiments have been shown and described above, it will be apparent to those skilled in the art that modifications and variations could be made without departing from the scope of the present invention as defined by the appended claims.

What is claimed is:

1. A photonic integrated circuit embedded substrate, comprising:
   an embedded insulating layer in which a photonic integrated circuit is disposed; and
   at least one first insulating layer stacked on one surface of the embedded insulating layer,
   wherein the at least one first insulating layer has an optical path extending in a stacking direction of the at least one first insulating layer.

2. The photonic integrated circuit embedded substrate of claim 1, wherein the optical path overlaps the photonic integrated circuit in the stacking direction.

3. The photonic integrated circuit embedded substrate of claim 1, further comprising:
   a cover insulating layer stacked on one surface of the at least one first insulating layer and having a plurality of openings,
   wherein one of the plurality of openings overlaps the optical path in the stacking direction.

4. The photonic integrated circuit embedded substrate of claim 3, wherein a width of the one of the plurality of openings is wider than a width of the optical path.

5. The photonic integrated circuit embedded substrate of claim 3, further comprising:
   at least one first conductive via penetrating through the at least one first insulating layer in the stacking direction and overlapping another of the plurality of openings in the stacking direction; and
   an embedded conductive via penetrating through the embedded insulating layer in the stacking direction and connected to the at least one first conductive via.

6. The photonic integrated circuit embedded substrate of claim 5, further comprising:
   at least one second insulating layer stacked on the other surface of the embedded insulating layer; and
   at least one second conductive via penetrating through the at least one second insulating layer in the stacking direction and connected to the embedded conductive via.

7. The photonic integrated circuit embedded substrate of claim 1, further comprising:
   at least one second insulating layer stacked on the other surface of the embedded insulating layer.

8. The photonic integrated circuit embedded substrate of claim 7, wherein the at least one second insulating layer does not have an optical path.

9. The photonic integrated circuit embedded substrate of claim 7, further comprising:
   at least one third conductive via penetrating through the at least one second insulating layer in the stacking direction and overlapping the photonic integrated circuit in the stacking direction.

10. The photonic integrated circuit embedded substrate of claim 1, further comprising:

a conductive tube surrounding the optical path.

11. The photonic integrated circuit embedded substrate of claim 1, wherein the number of the at least one first insulating layer is provided in plural.

12. The photonic integrated circuit embedded substrate of claim 11, wherein a thickness of the embedded insulating layer is greater than a thickness of each of the at least one of the first insulating layers.

13. The photonic integrated circuit embedded substrate of claim 1, wherein the embedded insulating layer has a cavity in which the photonic integrated circuit is disposed.

14. The photonic integrated circuit embedded substrate of claim 1, wherein the optical path penetrates through the at least one first insulating layer and comprises air or a vacuum.

15. The photonic integrated circuit embedded substrate of claim 1, wherein the at least one first insulating layer contains a photosensitive insulating material.

16. The photonic integrated circuit embedded substrate of claim 1, wherein the photonic integrated circuit comprises at least one of a light emitting unit for outputting an optical communication signal to the optical path and a light receiving unit for receiving an optical communication signal through the optical path.

17. A photonic integrated circuit package, comprising:

the photonic integrated circuit embedded substrate of claim 1; and a base substrate disposed on one surface of the photonic integrated circuit embedded substrate and having a structure in which at least one base insulating layer and at least one base conductive layer are alternately stacked, wherein the base substrate has an extended optical path overlapping the optical path in the stacking direction.

18. The photonic integrated circuit package of claim 17, wherein an insulating material of the at least one first insulating layer is different from an insulating material of the at least one base insulating layer.

19. The photonic integrated circuit package of claim 17, further comprising:

a solder connecting between the photonic integrated circuit embedded substrate and the base substrate and having a melting point, lower than a melting point of the base conductive layer.

20. The photonic integrated circuit package of claim 19, further comprising:

a first pad disposed on the photonic integrated circuit embedded substrate and connected to at least a portion of the solder; and a second pad disposed on the base substrate and connected to at least a portion of the solder, wherein a width of the first pad is narrower than a width of the second pad.

21. The photonic integrated circuit package of claim 17, further comprising:

a semiconductor chip disposed on the other surface of the photonic integrated circuit embedded substrate and connected to the photonic integrated circuit embedded substrate.

22. The photonic integrated circuit package of claim 21, further comprising:

an interposer substrate disposed between the photonic integrated circuit embedded substrate and the semiconductor chip.

23. The photonic integrated circuit package of claim 17, further comprising:

an optical connector disposed on the base substrate to overlap the extended optical path in the stacking direction; and an optical fiber connected to the optical connector.

* * * * *